United States Patent [19]
Wei et al.

[11] Patent Number: 6,046,084
[45] Date of Patent: Apr. 4, 2000

[54] ISOTROPIC ETCHING OF A HEMISPHERICAL GRAIN SILICON LAYER TO IMPROVE THE QUALITY OF AN OVERLYING DIELECTRIC LAYER

[75] Inventors: Sung-Min Wei, Taichung; Tung-Chia Ching, Kaoshung, both of Taiwan

[73] Assignee: Vanguard International Semiconductor Corporation, Hsin-Chu, Taiwan

[21] Appl. No.: 09/389,884

[22] Filed: Sep. 3, 1999

[51] Int. Cl.[7] .................................................. H01L 21/8242
[52] U.S. Cl. .......................... 438/255; 438/253; 438/396; 438/398; 438/964
[58] Field of Search .................................... 438/255, 398, 438/396, 253, 964; 257/68, 71

[56] References Cited

U.S. PATENT DOCUMENTS 5,639,685  6/1997  Zahurak et al. ........................ 438/658
5,656,531  8/1997  Thakur et al. .......................... 438/398
5,837,582  11/1998 Su ............................................. 438/255
5,913,119  6/1999  Lin et al. ................................ 438/255
5,930,625  7/1999  Lin et al. ................................ 438/253

Primary Examiner—Charles Bowers
Assistant Examiner—Hsien Ming Lee
Attorney, Agent, or Firm—George O. Saile; Stephen B. Ackerman

[57] ABSTRACT

A process for creating a storage node structure, for a DRAM capacitor structure, featuring increased storage node surface area, via use of an HSG silicon layer, on an underlying storage node shape, has been developed. The process features the use of an isotropic, buffered HF etch procedure, applied to the HSG silicon layer, to increase the space between the concave and convex features, of the HSG silicon layer. The increased space between the concave and convex features of the HSG silicon layer, allows a capacitor dielectric layer, of uniform thickness, to be formed on the isotopically etched, HSG silicon layer.

23 Claims, 3 Drawing Sheets

ISOTROPIC ETCHING OF A HEMISPHERICAL GRAIN SILICON LAYER TO IMPROVE THE QUALITY OF AN OVERLYING DIELECTRIC LAYER

BACKGROUND OF THE INVENTION (1) Field of the Invention

The present invention relates to a method used to fabricate a storage node structure, for a DRAM capacitor structure, and more specifically to a method of optimizing a hemispherical grain silicon layer, prior to formation of an overlying capacitor dielectric layer.

(2) Description of the Prior Art

The major objectives of the semiconductor industry are to continually improve the performance of semiconductor devices, while still maintaining, or decreasing the cost of fabricating these same semiconductor devices. These objectives have been successfully addressed by the ability of the semiconductor industry to produce semiconductor chips with sub-micron features, or micro-miniaturization. Smaller features allow a reduction in performance degrading capacitances and resistances to be realized. In addition smaller features result in a smaller chip, however still possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source, of a source/drain region, of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of a billion cells per chip, or greater, has resulted in a specific cell in which a smaller transfer gate transistor is being used, resulting in less of an overlying area for placement of overlying STC structures.

One method that has been used to increase STC capacitance, while still decreasing the lateral dimension of the capacitor, has been the use of rough, or hemispherical grain (HSG), silicon layers. The HSG silicon layer is comprised of convex and concave features, and when used as the top layer of the storage node structure, results in a greater degree of surface area then counterparts fabricated with smooth silicon layers. However the space between the convex and concave features, of the HSG silicon layer, can present difficulties when attempting to form a capacitor dielectric layer, uniformly on the underlying HSG silicon layer. If the spaces between HSG silicon features is to small to accept the desired thickness of the capacitor dielectric layer, a thinner than desired capacitor dielectric layer will formed, which can present yield and reliability concerns, in terms of dielectric leakage, or breakdown, during normal DRAM operating conditions.

This invention will describe a novel process preparing an HSG silicon layer, for formation of an overlying, capacitor dielectric layer. Prior to the formation of the capacitor dielectric layer, the HSG silicon layer is subjected to an isotropic etch, increasing the space between the HSG silicon layer, concave and convex features, thus allowing the formation of a uniform, in thickness, capacitor dielectric layer, to be realized.

Prior art such as Thakur et al, in U.S. Pat. No. 5,656,531, or Zahurak et al, in U.S. Pat. No. 5,639,685, describe processes for fabricating HSG silicon layers, however these prior art do not describe the isotropic etch procedure, applied to the HSG silicon layer, prior to the formation of the capacitor dielectric layer, allowing the formation of a uniform capacitor dielectric layer.

SUMMARY OF THE INVENTION

It is an object of this invention to create a DRAM capacitor structure, in which a capacitance increase is achieved by increasing the surface area of the storage node structure, comprised of a hemispherical grain, (HSG), silicon layer, residing on the surface of an underlying storage node shape.

It is another object of this invention to subject the HSG silicon layer to an isotropic etch, to increase the space between HSG silicon layer, concave and convex features, and to round the sharp corners of the HSG silicon layer features.

It is yet another object of this invention to form a uniform thickness, capacitor dielectric layer, on the isotopically etched, HSG silicon layer.

In accordance with the present invention a method for fabricating a storage node structure, comprised of a HSG silicon layer, on the surface of a storage node shape, and featuring an isotropic etch, performed on the HSG silicon layer, to increase the space between the concave and convex features of the HSG silicon layer, prior to the formation of a capacitor dielectric layer, has been developed. A transfer gate transistor comprised of: a thin gate insulator; a polysilicon gate structure, capped with an overlying insulator layer; a lightly doped source/drain region; insulator spacers on the sidewalls of the polysilicon gate structure; and heavily doped source/drain region; are formed on a semiconductor substrate. An insulator layer is deposited on the transfer gate transistor, followed by the creation of a storage node contact hole, in the insulator layer, exposing a source region, of the transfer gate transistor. A doped polysilicon plug is formed in the storage node contact hole, contacting the source region of the transfer gate transistor. A storage node shape, comprised with amorphous silicon, or polysilicon, is formed, overlying and contacting the top surface of the doped polysilicon plug. An HSG silicon layer is next formed on the top surface of the storage node shape, via selective deposition of HSG silicon seeds, on the exposed surfaces of the storage node shape, followed by an anneal cycle, creating the HSG silicon layer, and resulting in a storage node structure comprised of an HSG silicon layer, on an underlying storage node shape. An isotopically etched HSG silicon layer, is then created via subjection of the HSG silicon layer to a buffered hydrofluoric acid solution, resulting in increased space between the concave and convex features, of the isotopically etched HSG silicon layer. A capacitor dielectric layer is next formed on the isotopically etched, HSG layer, followed by the creation of an upper polysilicon electrode, completing the formation of stacked capacitor structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming a DRAM capacitor structure, featuring an isotopically etched, HSG silicon layer, used as the top layer of a storage node structure, with the HSG silicon layer isotopically etched, to increase the space between the concave and convex features of the HSG silicon layer, and to allow a capacitor dielectric layer, with a uniform thickness, to be formed on the isotopically etched HSG silicon layer, will now be described. The transfer gate transistor, used for the DRAM device, of this invention, will be an N channel device. However this invention, using an isotopically etched, HSG silicon layer as the top surface layer of a storage node structure, can also be applied to P channel, transfer gate transistor.

Figure 1:
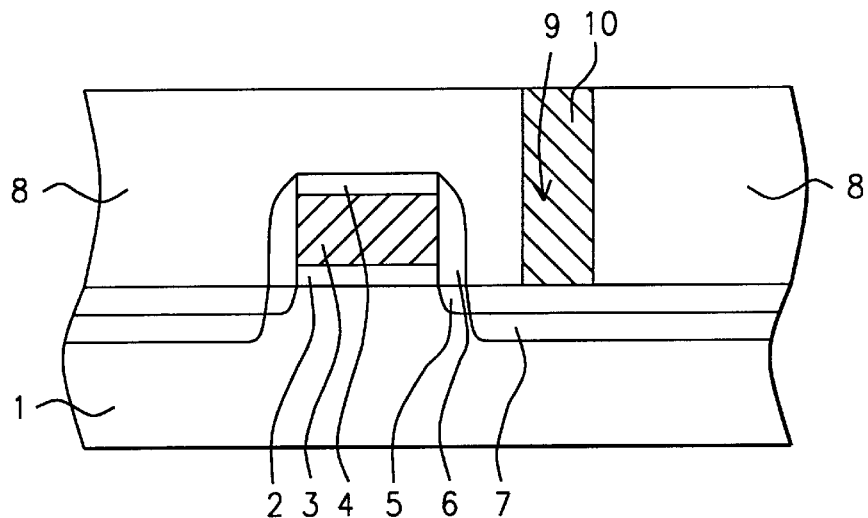
FIGS. 1–5, which schematically, in cross-sectional style, shows the key fabrication stages used in the creation of a DRAM, stacked capacitor structure, featuring a capacitor dielectric layer, on an isotopically etched, HSG silicon layer, which in turn is located on the exposed surfaces of a storage node shape.

Referring to FIG. 1, a P type, semiconductor substrate 1, with a <100>, single crystalline orientation, is used. After a series of wet cleans, a gate insulator layer 2, comprised of silicon dioxide, is thermally grown in an oxygen-steam ambient, at a temperature between about 750 to 1050° C., to a thickness between about 40 to 200 Angstroms. Polysilicon layer 3, is next deposited using a low temperature chemical vapor deposition, (LPCVD), procedure, at a temperature between about 500 to 700° C., to a thickness between about 500 to 4000 Angstroms. The polysilicon layer can either be grown intrinsically and doped via ion implantation of arsenic or phosphorous, or polysilicon layer 3, can be in situ doped during deposition via the incorporation of either arsine, or phosphine, to the silane, or disilane ambient. If lower word line, or gate resistance is desired, polysilicon layer 3, can be replaced by a polycide layer, comprised of a metal silicide layer, such as tungsten silicide or titanium silicide, residing on an underlying doped polysilicon layer. A silicon oxide layer 4, used as a cap insulator layer, is next grown via LPCVD or via a plasma enhanced chemical vapor deposition, (PECVD), procedure, to a thickness between about 600 to 2000 Angstroms. If desired the capping insulator layer, can be a silicon nitride layer. Conventional photolithographic and reactive ion etching, (RIE), procedures, using CHF, as an etchant for silicon oxide layer 4, and using $Cl_2$ as an etchant for polysilicon or polycide layer 3, are used to define polysilicon gate structure shown schematically in FIG. 1. Removal of the photoresist shape, used for definition of the polysilicon gate structure, is accomplished using plasma oxygen ashing and careful wet cleans.

A lightly doped source/drain region 5, is next formed via ion implantation of phosphorous, at an energy between about 5 to 60 KeV, at a dose between about 1E13 to 1E15 atoms/$cm^2$. Another silicon oxide layer is then deposited, using either LPCVD or PECVD procedures, at a temperature between about 400 to 850° C., to a thickness between about 1500 to 4000 Angstroms, followed by an anisotropic RIE procedure, using $CHF_3$ as an etchant, creating insulator spacers 6, located on the sides of the polysilicon gate structure. If desired insulator spacers 6, can be formed using silicon nitride. A heavily doped source/drain region 7, is then formed via ion implantation of arsenic, at an energy between about 30 to 100 KeV, at a dose between about 1E14 to 5E16 atoms/$cm^2$. The result of these procedures are again schematically shown in FIG. 1.

An insulator layer 8, comprised of either silicon oxide, or boro-phosphosilicate glass, (BPSG), is next deposited via LPCVD or PECVD procedures, to a thickness between about 1000 to 5000 Angstroms. A chemical mechanical polishing, (CMP), procedure is next used to planarize the silicon oxide, insulator layer 8, to create a smooth top surface topography. If a BPSG layer is used, a reflow procedure, performed at a temperature between about 700 to 1000° C., is employed to create the desired smooth top surface topography. Conventional photolithographic and RIE procedures, using for insulator layer 8, are used to open storage node contact holes 9, in insulator layer 8, exposing the top surface of heavily doped source/drain region 8. This is schematically shown in FIG. 1. Removal of the photoresist shape, used as an etch mask for the creation of storage node contact hole 9, is performed via use of plasma oxygen ashing and careful wet cleans. A polysilicon layer is next deposited, using LPCVD procedures, at a thickness between about 1000 to 6000 Angstroms. The polysilicon layer is in situ doped, during deposition, via the addition of arsine, or phosphine, to a silane or disilane ambient, resulting in a bulk concentration for the polysilicon layer, between about 1E19 to 2E20 atoms/$cm^3$. The formation of doped polysilicon plug 10, in storage node contact holes 9, shown schematically in FIG. 1, is accomplished via removal of unwanted regions of polysilicon, from the top surface of insulator 8, using either a selective RIE procedure, using $Cl_2$ as an etchant, or via a CMP procedure.

Figure 2:
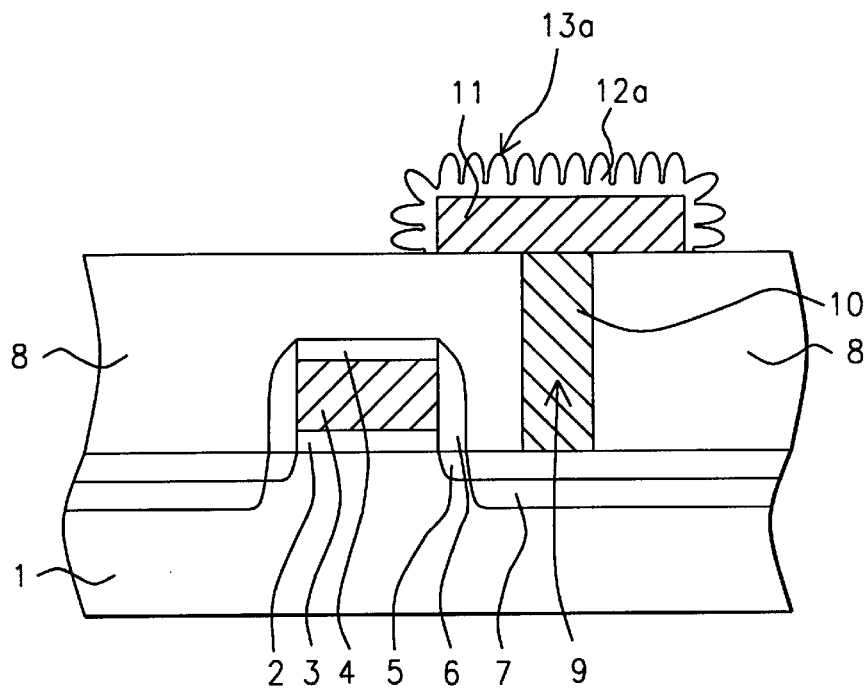

An amorphous silicon, or a polysilicon layer, is next deposited, at a thickness between about 400 to 600 Angstroms, via LPCVD procedures, at a temperature between about 450 to 650° C. The amorphous silicon, or polysilicon layer, is doped in situ, during the LPCVD procedure, via the addition of phosphine, or arsine, to a silane, or to a disilane source, resulting in a bulk concentration between about 4E19 to 7E20 atoms/$cm^3$. Conventional photolithographic and anisotropic RIE procedures, using $Cl_2$ as an etchant for the amorphous silicon, or polysilicon layer, are employed to form storage node shape 11, shown schematically in FIG. 2.

After removal of the photoresist shape, used to define storage node shape 11, via plasma oxygen ashing and careful wet cleans, preparation for the formation of an HSG silicon layer is addressed, via use of an HF vapor pre-clean procedure, used to remove native oxide from the surface of storage node shape 11. The HF vapor clean procedure can be performed prior to deposition of an HSG silicon seed layer, in the same tool that will be used for the subsequent formation of the HSG silicon seed layer. The selective deposition of an HSG silicon seed layer, on the exposed surfaces of storage node shape 11, is next accomplished, in situ, in the same tool used for the HF pre-clean procedure, at a temperature between about 450 to 650° C., at a pressure between about 0.4 to 1.2 mtorr, using silane, or disilane, as a source. An anneal procedure, performed at a temperature between about 450 to 650° C., at a pressure between about 0.4 to 1.2 mtorr, in a nitrogen ambient, is then used to convert HSG silicon seed layer to HSG silicon layer 12a, schematically shown in FIG. 2, resulting in a storage node structure, comprised of HSG silicon layer 12a, on storage node shape 11. Spaces 13a, with a width between about 50 to 150 Angstroms, are shown to represent the narrow spacing that exists between the concave and convex features of HSG silicon layer 12a.

Figure 3:
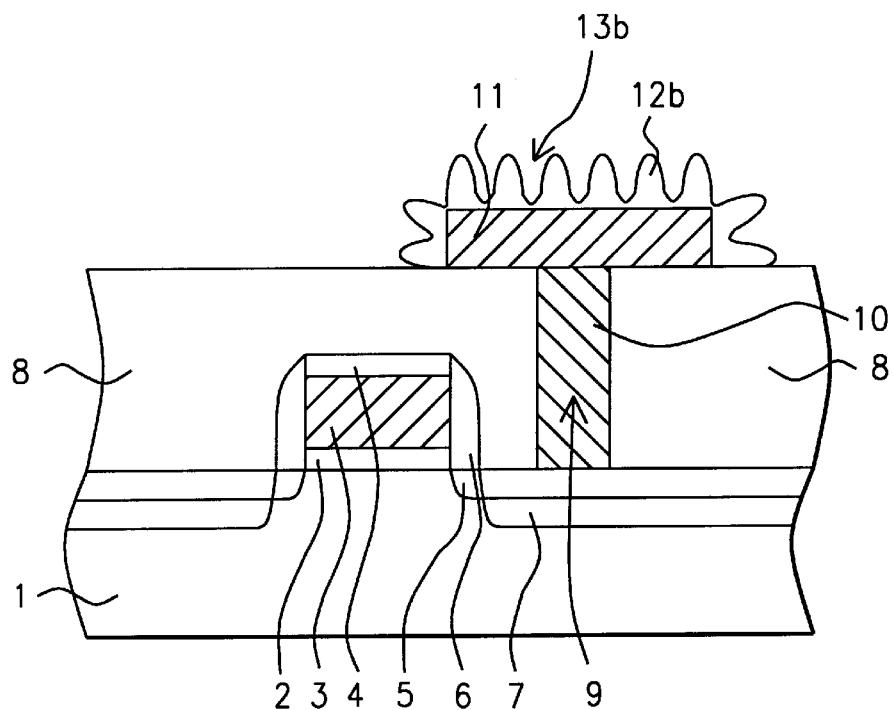

The narrow spaces 13a, located between the concave and convex features of HSG silicon layer 12a, can create a problem when attempting to form a uniform capacitor dielectric layer, on HSG silicon layer 12a. For example if narrow spaces 13a, can not accept the desired thickness of a deposited component of the capacitor dielectric layer, a thinner than desired, capacitor dielectric layer may not survive the voltage applied to the subsequent DRAM capacitor structure. Therefore a procedure used to increase the width of the space between the convex and concave features, of an HSG silicon layer, is employed. This is accomplished by subjecting HSG silicon layer 12a, to a buffered HF acid solution, comprised of 1 part $NH_4OH$, 1 part, 49% HF, and 10 parts $H_2O$. This isotropic etch procedure is performed at a temperature between about 20 to 25° C., for a time between about 1 to 3 min, resulting in the creation of isotopically etched, HSG silicon layer 12b. HSG silicon layer 12b, shown schematically in FIG. 3, now features spaces 13b, between about 100 to 350 Angstroms in width, located between the concave and convex features of HSG silicon layer 12b, with spaces 13b, now large enough to accept the desired thickness of a deposited, capacitor dielectric component.

Figure 4:
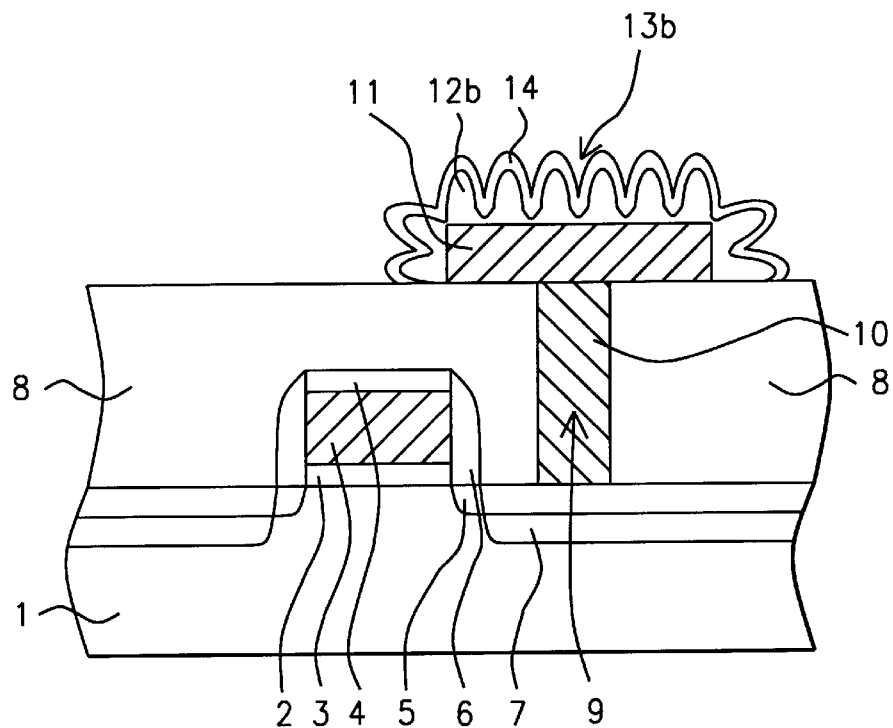

The formation of a capacitor dielectric layer 14, or of ONO, (Oxidized—silicon Nitride—silicon Oxide), layer 14, on isotopically etched, HSG silicon layer 12b, is next addressed and schematically shown in FIG. 4. The ONO layer is formed by initially growing a silicon oxide layer, between about 5 to 10 Angstroms, on the surface of HSG silicon layer 12b, via subjecting the HSG silicon layer to a $H_2SO_4$ acid solution, at a temperature between about 100 to 150° C., for a time between about 2 to 7 min. Next a silicon nitride layer is deposited, via LPCVD or PECVD procedures, to a thickness between about 50 to 55 Angstroms. The silicon nitride layer, at this thickness, is easily accepted in spaces 13b, while the ability of forming the same thickness of silicon nitride, in untreated spaces 13a, would have been difficult. Finally an oxidation procedure is performed, at a temperature between about 750 to 900° C., in an oxygen—steam ambient, to create a silicon oxide layer, between about 5 to 10 Angstroms, on the remaining silicon nitride layer. ONO layer 14, shown schematically in FIG. 4, has an equivalent silicon oxide thickness of between about 45 to 75 Angstroms.

Figure 5:
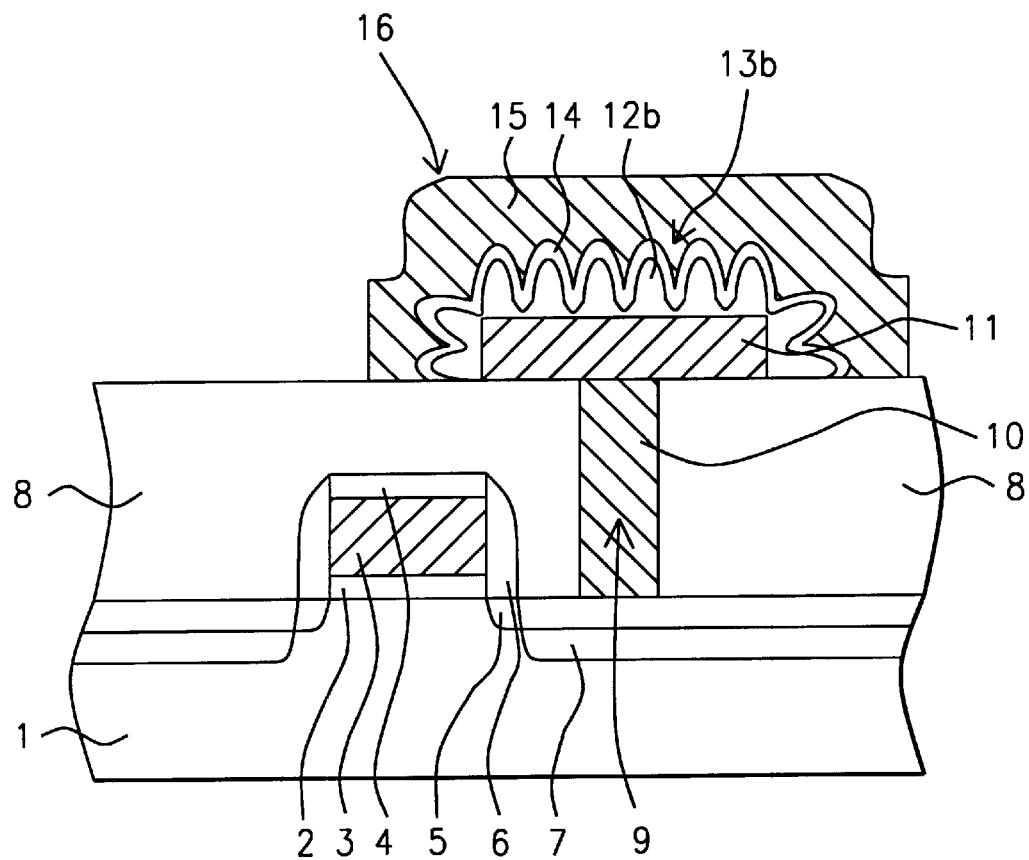

The completion of DRAM capacitor structure 16, is next addressed, and described schematically in FIG. 5. A polysilicon layer is deposited, via LPCVD procedures, to a thickness between about 1000 to 2000 Angstroms. Doping of the polysilicon layer is accomplished in situ, during deposition, via the addition of phosphine, or arsine, to a silane ambient. Photolithographic and RIE procedures, using $Cl_2$ as an etchant, are then employed to create polysilicon upper electrode structure, or cell plate structure 15, shown schematically in FIG. 5. The photoresist shape, used for definition of polysilicon upper electrode structure 15, is again removed via plasma oxygen ashing and careful wet cleans, resulting in DRAM capacitor structure 16, comprised with HSG silicon layer 12b, used as a component of the storage node structure, isotopically etched, to increase the space between concave and convex features, of this layer, allowing a uniform capacitor dielectric layer to be formed, overlying the isotopically etched, HSG silicon layer.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a capacitor structure, for a dynamic random access memory, (DRAM), device, on a semiconductor substrate, comprising the steps of:

providing a polysilicon plug structure, located in a storage node contact hole, in an insulator layer, with said polysilicon plug structure contacting a heavily doped source/drain region, of a transfer gate transistor;

forming a storage node shape, overlying, and contacting, the top surface of said polysilicon plug structure;

forming a first hemispherical grain, (HSG), silicon layer, on the surface of said storage node shape, with a first space between the concave and convex features of said first HSG silicon layer;

performing an isotopic etch procedure, to said first HSG silicon layer, to create a second HSG silicon layer, with a second space, located between the concave and convex features of said second HSG silicon layer, and resulting in a storage node structure, comprised of said second HSG silicon layer, on said storage node shape;

forming a capacitor dielectric layer on said second HSG silicon layer; and forming a polysilicon upper electrode structure.

2. The method of claim 1, wherein said polysilicon plug structure is formed from a polysilicon layer that is obtained via low pressure chemical vapor deposition (LPCVD) procedures, at a thickness between about 1000 to 6000 Angstroms, and in situ doped during deposition, via the addition of phosphine, or arsine, to a silane ambient, resulting in a bulk concentration for said polysilicon plug structure, between about 1E19 to 2E20 atoms/$cm^3$.

3. The method of claim 1, wherein said polysilicon plug structure is defined via removal of polysilicon from the top surface of said insulator layer, using either a chemical mechanical polishing, (CMP), procedure, or via a selective RIE procedure, using $Cl_2$ as an etchant.

4. The method of claim 1, wherein said storage node shape is comprised from either an amorphous silicon, or a polysilicon layer, obtained via LPCVD procedures, at a temperature between about 450 to 650° C., to a thickness between about 400 to 600 Angstroms, and doped in situ doped, during deposition, via the addition of arsine, or phosphine, to a silane, or disilane ambient, resulting in a bulk concentration between 4E19 to 7E20 atoms/$cm^3$.

5. The method of claim 1, wherein said storage node shape is defined in the amorphous silicon, or polysilicon layer, via conventional photolithographic and anisotropic RIE procedures, using $Cl_2$ as an etchant.

6. The method of claim 1, wherein said first HSG silicon layer is formed from an HSG silicon seed layer, where the HSG silicon seed layer is obtained via selective deposition at a temperature between about 450 to 650° C., at a pressure between about 0.4 to 1.2 mtorr, using silane, or disilane, as a source.

7. The method of claim 1, wherein said HSG silicon layer is formed via an anneal cycle, performed to an HSG silicon seed layer, at a temperature between about 450 to 650° C., at a pressure between about 0.4 to 1.2 mtorr, in a nitrogen ambient.

8. The method of claim 1, wherein the width of said first space, located between the concave and convex features of said first HSG silicon layer, is between about 50 to 150 Angstroms.

9. The method of claim 1, wherein said second HSG silicon layer, is formed via an isotropic etch, applied to said first HSG silicon layer, using a buffered hydrofluoric acid solution, comprised of 1 part $NH_4OH$, 1 part, 49% hydrofluoric acid, and 10 parts $H_2O$, at a temperature between about 20 to 25° C., for a time between about 1 to 3 min.

10. The method of claim 1, wherein the width of said second space, located between the concave and convex features of said second HSG silicon layer, is between about 100 to 350 Angstroms.

11. The method of claim 1, wherein said capacitor dielectric layer is an ONO, (Oxidized silicon Nitride on silicon Oxide), layer, at an equivalent silicon dioxide thickness between about 45 to 75 Angstroms, created by: first forming an underlying silicon oxide layer, at a thickness between about 5 to 10 Angstroms, via use of a $H_2SO_4$ procedure, performed to said second HSG silicon layer, at a temperature between about 100 to 150° C.; followed by a PECVD or LPCVD procedure, used to obtain a silicon nitride layer, at a thickness between about 50 to 55 Angstroms; and completed by an oxidation procedure, performed at a temperature between about 750 to 900° C., in an oxygen—steam ambient, to convert a top portion of the silicon nitride layer, to a silicon oxide layer, between about 5 to 10 Angstroms in thickness.

12. A method of fabricating a storage node structure, for a DRAM capacitor structure, on a semiconductor substrate, comprised of a hemispherical grain, (HSG), silicon layer, on an underlying storage node shape, with the space between the concave and convex features of the HSG silicon layer, increased via an isotropic etching procedure, performed to the HSG silicon layer, comprising the steps of:

forming a storage node contact hole, in an insulator layer, exposing a portion of a source/drain region of a transfer gate transistor, at the bottom of said storage node structure;

depositing a first polysilicon layer;

forming a polysilicon plug structure, comprised of said first polysilicon layer, in said storage node contact hole, contacting the portion of said source/drain region, located at the bottom of said storage node contact hole;

depositing a second polysilicon layer;

patterning of said second polysilicon layer, to form a polysilicon storage node shape, overlying, and contacting, the top surface of said polysilicon plug structure;

performing a pre-clean procedure;

selectively depositing a hemispherical grain, (HSG), silicon seed layer, on the exposed surfaces of said polysilicon storage node shape;

performing an anneal cycle, to form a first HSG silicon layer, from said HSG silicon seeds, with said first HSG silicon layer featuring a first space between the concave and convex features of said first HSG silicon layer;

performing a buffered hydrofluoric acid, isotropic etch procedure, to convert said first HSG silicon layer, to a second HSG silicon layer, with said second HSG silicon layer, featuring a second space between the concave and convex features of said second HSG silicon layer, larger in width than said first space, located between the concave and convex features of said first HSG silicon layer;

forming a capacitor dielectric layer on said second HSG silicon layer;

depositing a third polysilicon layer; and patterning of said third polysilicon layer to form a polysilicon upper electrode structure, for said DRAM capacitor structure.

13. The method of claim 12, wherein said first polysilicon layer, used to form said polysilicon plug structure, is obtained via LPCVD procedures, at a thickness between about 1000 to 6000 Angstroms, and doped in situ, during deposition, via the addition of arsine, or phosphine, to a silane ambient, resulting in a bulk concentration for said first polysilicon layer, between about 1E19 to 2E20 atoms/$cm^3$.

14. The method of claim 12, wherein said polysilicon plug structure is formed in said storage node contact hole, via removal of regions of said first polysilicon layer, from the top surface of said insulator layer, via a chemical mechanical polishing procedure, or via a selective RIE procedure, using $Cl_2$ as an etchant.

15. The method of claim 12, wherein said second polysilicon layer is obtained via LPCVD procedures, at a thickness between about 400 to 600 Angstroms, and doped in situ, during deposition, via the addition of phosphine, or arsine, to a silane, or to a disilane ambient, resulting in a bulk concentration for said second polysilicon layer, between about 4E19 to 7E20 atoms/$cm^3$.

16. The method of claim 12, wherein said polysilicon storage node shape, is defined from said second polysilicon layer, via photolithographic and anisotropic reactive ion etching (RIE) procedures, using $Cl_2$ as an etchant.

17. The method of claim 12, wherein said pre-clean procedure, is performed to said polysilicon storage node shape, prior to selective deposition of said HSG silicon seed layer, using HF vapors.

18. The method of claim 12, wherein said HSG silicon seed layer is formed at a temperature between about 450 to 650° C., at a pressure between about 0.4 to 1.2 mtorr, using silane, or disilane, as a source, in a nitrogen ambient.

19. The method of claim 12, wherein said first HSG silicon layer is formed from said HSG silicon seed layer via said anneal cycle, performed at a temperature between about 450 to 650° C., at a pressure between about 0.4 to 1.2 mtorr, in a nitrogen ambient.

20. The method of claim 12, wherein said first space, located between the concave and convex features of said first HSG silicon layer, is between about 50 to 150 Angstroms in width.

21. The method of claim 12, wherein said buffered hydrofluoric acid, isotropic etch procedure, used to convert said first HSG silicon layer, to said second HSG silicon layer, is performed at a temperature between about 20 to 25° C., for a time between about 1 to 3 min, in a solution comprised of 1 part $NH_4OH$, 1 part, 49% hydrofluoric acid, and 10 parts $H_2O$.

22. The method of claim 12, wherein said second space, located between the concave and convex features of said second HSG silicon layer, is between about 100 to 350 Angstroms in width.

23. The method of claim 12, wherein said capacitor dielectric layer, is an ONO, (Oxidized silicon Nitride on silicon Oxide), layer, at an equivalent silicon oxide thickness between about 45 to 75 Angstroms, obtained by: forming an underlying silicon oxide layer, at a thickness between about 5 to 10 Angstroms, via subjection of said second HSG silicon layer, to a $H_2SO_4$ solution, at a temperature between about 100 to 150° C.; depositing a silicon nitride layer, via LPCVD or PECVD procedures, at a thickness between about 50 to 55 Angstroms; then performing an oxidation procedure, in an oxygen—steam ambient, at a temperature between about 750 to 900° C., to convert a top portion of the silicon nitride layer to between about 5 to 10 Angstroms of silicon oxide.

* * * * *